(12) United States Patent
Chen et al.

(10) Patent No.: US 6,316,995 B1
(45) Date of Patent: Nov. 13, 2001

(54) INPUT STAGE FOR CONSTANT GM AMPLIFIER CIRCUIT AND METHOD

(75) Inventors: Sean S. Chen, Sunnyvale, CA (US); Stuart B. Shacter, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/587,245

(22) Filed: Jun. 2, 2000

(51) Int. Cl.[7] ........................................... H03F 3/45
(52) U.S. Cl. ......................... 330/252; 330/257; 330/261
(58) Field of Search .................................. 330/252, 257, 330/261

(56) References Cited

U.S. PATENT DOCUMENTS

| | | | |
|---|---|---|---|
| 4,636,744 | * | 1/1987 | King et al. .......................... 330/295 |
| 4,835,488 | * | 5/1989 | Garuts ................................. 330/258 |
| 5,153,529 | * | 10/1992 | Koda et al. ......................... 330/295 |
| 5,574,401 | * | 11/1996 | Spitainy ............................. 330/253 |

FOREIGN PATENT DOCUMENTS 0 190 469 * 8/1986 (EP) .

* cited by examiner

Primary Examiner—Michael B Shingleton
(74) Attorney, Agent, or Firm—Girard & Equitz LLP

(57) ABSTRACT

An amplifier input stage having a constant input gm and including first and second differential transistor pair so as to provide operation with inputs at or near the upper and lower power supply rails. A comparator circuit operates to control which of the transistor pair is active based upon the relative magnitudes of the amplifier input stage inputs and a reference voltage.

12 Claims, 4 Drawing Sheets

US 6,316,995 B1

INPUT STAGE FOR CONSTANT GM AMPLIFIER CIRCUIT AND METHOD

BACKGROUND OF THE INVENTION

1. Field of the Invention

The present invention relates generally to amplifier circuits and, in particular, to a constant gm amplifier circuits capable of operating near the power supply rails.

2. Description of Related Art

Referring to the drawings, FIG. 1 is a block diagram of a conventional constant gm amplifier A and associated circuitry configured to provide a regulated current output IA. In the disclosed embodiment, the output current is used to charge a capacitor C. The amplifier has a differential input with a built in input offset voltage. The inverting and non-inverting inputs of amplifier A are connected across a resistor RA. The output of the amplifier drives a PNP transistor Qx, the collector of which is coupled to resistor RA by way of a diode D1. The emitter of Qx is connected to a positive supply voltage VCC by way of a bias circuit BC. In the disclosed example, the supply voltage VCC may fall in the range of +3 to +30 volts.

Amplifier A operates to maintain a voltage across resistor RA at a value equal to the input offset voltage of the amplifier. That offset voltage is typically set to be on the order of tens of millivolts. If the voltage across RA is too large, the output of amplifier A will increase thereby decreasing the base-emitter voltage of Qx. This will reduce the current flow through IA through resistor RA. Similarly, a drop in voltage across RA will cause the base-emitter voltage to increase so that the current IA will increase. Thus, current IA is a regulated current. The current is used to charge a capacitor so as to produce a linearly changing voltage across capacitor C.

Since the voltage across capacitor C can drop to essentially zero volt and can increase to a value approaching VCC, Amplifier A must be implemented to function even when the inputs to the amplifier are close to the upper and lower power supply rails. FIG. 2 is a simplified schematic diagram of part of a conventional input stage for amplifier A. Two differential transistor pair are used in order to provide the at or near rail-to-rail operation. A first transistor pair, NPN transistors QA and QB, have respective bases that receive differential input In+ and In−. When the common mode voltage, the average value of In+ and In−, approaches the positive supply rail, transistors QA and QB are active and provide at their collectors a differential output current which is further amplifier by an intermediate stage (not depicted) following the input stage. When the common mode input voltage approaches the negative supply rail, ground in this case, a second pair of transistors, PNP transistors QC and QD, are active. The differential input In+ and In− is applied to the respective based of transistors QC and QD. Again, the differential output current at the collectors of QC and QD is further amplified by the following stage.

An emitter resistor RB is connected between the emitter of transistor QD and the tail current source IB so as to introduce an input offset voltage when pair QC and QD are active. A second emitter resistor RC, equal in value to RB, is connected between the emitter of transistor QA and the output of the current mirror circuit transistor QG. Resistor RC operates to introduce an input offset voltage when transistor pair QA and QB are active. The offset voltages produced by resistor RB and RC are ideally equal in value. In a typical implementation, resistors RB and RC are both 2 k ohms.

A current source IB is connected as a tail current source for differential pair QC and QD. IB has a typical value of 10 microamperes. A pair of NPN transistors QF and QG are connected as a current mirror and function as the tail current source for differential pair QA and QB. A PNP transistor QE has a collector connected to the collector-base short of QF, the input of the current mirror, an emitter connected to the output of tail current source IB and a base connected to a bias voltage source VB.

The positive component In+ is roughly indicative of the common mode input voltage, the average value of In+ and In−. When In+ is less than the value of bias voltage VB, the emitter voltage of transistor QE is sufficiently low relative to the base voltage to cause transistor QE to be off. Thus, the input to the current mirror circuit will be zero as will the output at the collector of QG. Accordingly, transistor pair QA/QB, which operates using the current mirror output as the tail current source, will be inactive. Transistor pair QC and QD will be active, with these transistor being capable of operation with inputs essentially at the negative supply rail (ground potential).

Assuming that value of In+ exceeds the value of VB, transistor QE will become conductive. All of the current from source IB will flow through transistors QE rather than QC and QD so that pair QC/QD become inactive. The current flow IB through QE will mirrored by the current mirror circuit so that the collector current of QG will be equal to IB. Thus, transistors QA and QB will become active, with these transistors being capable of operation at or near the positive supply rail.

The input offset voltage when pair QC/QD is active due to the presence of resistor RB and is equal to RB(IB/2) or 10 millivolts in the present example.

Similarly, the input offset voltage when pair QA/QB is active is equal in lieu thereof RC(ICE/2), with ICE being the collector current of transistor QG. Assuming that RB and RC are equal and that IB and ICE are equal, the offset voltage is the same, 10 millivolts, independent of which transistor pair is active.

As previously noted, the voltage drop across resistor RA (FIG. 1) is maintained equal to the input offset voltage of amplifier A. Thus, a regulated current IA is produced which, in the present example, is used to charge capacitor C. Although the voltage drop across resistor RA, the difference between the voltages at In+ and In−, is regulated to be 10 millivolts, the average of the two voltages, the common mode voltage, will change as the charge on capacitor C changes. Depending upon the value of the voltage at the junction of resistor RA and diode D1, either transistor pair QA/QB or pair QC/QD is active. Referring to FIG. 3, the depicted graph shows the relationship between the regulated output current IA of the circuit of FIG. 1, using the conventional input stage of FIG. 2, and the voltage In+ applied to the non-inverting input of the amplifier A. Voltage VB of the FIG. 2 circuit is set at about +4.4 volts. Depending upon the actual positive and negative supply rail voltages, it is preferable that voltage VB be selected so as to be significantly closer to one or the other supply rails so that only one of the transistor pair is active for most of the operating conditions. This is preferable to setting VB at some midpoint which would increase the likelihood the circuit will be frequently switching between the two pair.

When In+ is substantially less than VB, it can be seen by inspection of the circuit of FIG. 2 that the regulated current IA is determined by the voltage drop across resistor RB, the voltage that creates the input offset voltage dropped across resistor RA. That voltage is nominally IB/2(RB) or 10 millivolts. When In+ is substantially greater than VB, the input offset voltage is determined by the voltage drop across RC. Again, that voltage is nominally IB/2(RC). However, when the input Vin+ is close to VB, the graph of FIG. 3 shows that the input offset voltage drops substantially thereby causing the current flow through resistor RA to drop from a nominal value of 40 milliamperes to approximately only 15 milliamperes.

The drop in input offset voltage is due to the fact that the current flow IB/2 through resistor RB does not instantly switch to resistor RC, particularly when In+ or the common mode input voltage is constant or changing slowly. Further, under these conditions where the common mode input voltage happens to fall near the transition voltage and remains there for a significant amount of time, there is a likelihood that any noise on the amplifier A inputs or elsewhere would cause the amplifier to become unstable. At best, under these conditions the input offset voltage of amplifier A will drop to a fraction of the nominal value thereby effectively altering the gm of amplifier A and causing the regulated current IB to become unregulated. This undesirable change in gm would be present even if offset resistors RB and RC were not present, but the presence of the resistors reduces the gain of the input stage and increases the time required to switch from one input transistor pair to another.

There is thus a need for an amplifier having the capability of operating near or at the power supply rails and yet provide a relatively constant gm. The present invention overcomes the above-noted limitations of the prior art amplifier input stages. These and other advantages of the present invention will become apparent to those skilled in the art upon a reading of the following Detailed Description of the Invention together with the drawings.

SUMMARY OF THE INVENTION

An amplifier input stage capable of operation at or near the upper and lower power supply rails and having a constant input gm is disclosed. The input stage includes first and second differential transistor input pair, with each pair having bases coupled to the differential input of the input stage.

A comparator circuit is provided, which is separate from the first and second differential transistor pairs, which operates to compare the input signals applied to the input stage with a reference voltage. When the comparator circuit is in a first state, a tail current source associated with the first differential pair is made active, with a tail current source associated with the second differential pair being inactive. When the comparator circuit is in a second state, a tail current source associated with the second differential pair is made active, with the tail current source associated with the first differential pair being inactive.

DETAILED DESCRIPTION OF THE INVENTION

Figure 4:
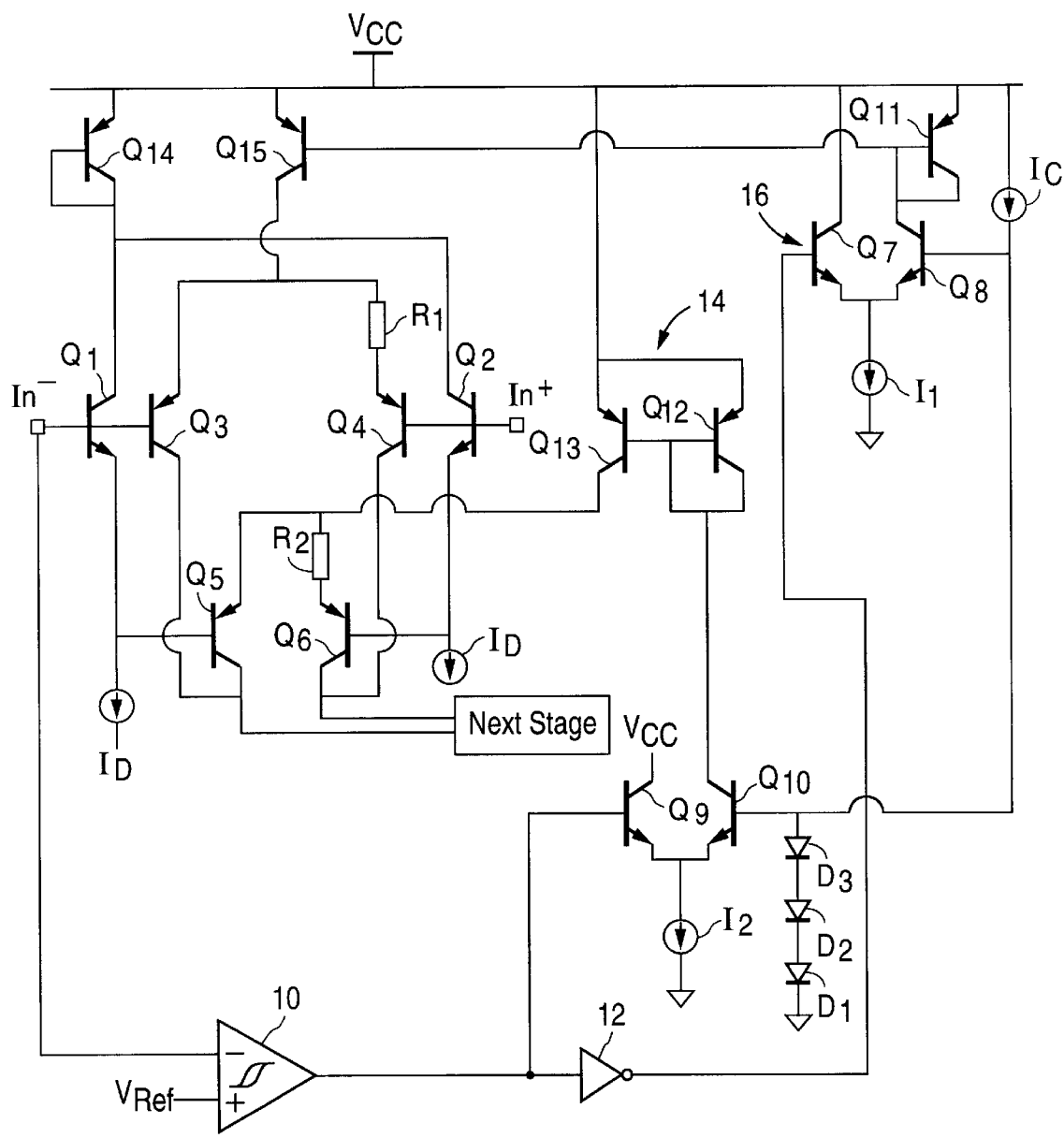
FIG. 4 is an amplifier input stage in accordance with one embodiment of the present invention.

Referring again to the drawings, FIG. 4 is a schematic diagram of an amplifier input stage in accordance with one embodiment of the present invention. The input stage includes three differential pair, with a NPN differential pair Q1 and Q2 basically operating as a level shifting circuit. The bases of transistors Q1 and Q2 are connected to receive inputs In– and In+, respectively. The collectors of Q1 and Q2 are connected to a diode-connected transistor Q14 which is, in turn, connected to the positive supply rail VCC. Transistor Q14 operates to prevent the base-collector junction of Q1 and Q2 from being forward biased should inputs In+ and In– momentarily exceed the positive supply voltage. The emitters of Q1 and Q2 are connected to respective current sources ID for biasing.

Transistors Q3 and Q4 form a differential PNP transistor pair having their respective bases connected to receive inputs In– and In+. Transistor pair Q3 and Q4 share a common tail current source which includes PNP transistor Q15. An offset resistor R1 is connected between the emitter of Q4 and the tail current source transistor Q15.

Transistors Q5 and Q6 form a second differential PNP transistor pair having respective bases connected to receive inputs I– and I+ and respective collectors coupled to the respective collectors of Q3 and Q4. The collector outputs are coupled to an intermediate stage of the amplifier which is not depicted. Transistor pair Q5/ Q6 shares a common tail current source which includes transistor Q13. An offset resistor R2 is connected between the emitter of Q6 and the tail current source transistor Q13.

As will be explained in greater detail, transistor pair Q3/Q4 is rendered active when the inputs In– and In+ are at or near the negative supply rail or circuit common. Q3 and Q4 are not capable of handling inputs near the positive supply voltage VCC due to the base-emitter voltage drops of the transistors. Transistor pair Q5 and Q6 are active when the inputs In– and In+ are near the positive supply voltage. The base-emitter voltages of NPN pair Q1 and Q2 effectively offset the base-emitter voltages of Q5 and Q6 so that the only limitation affecting operation of the pair near the positive supply is the voltage required by tail current source transistor Q13. Transistor Q13 operates in saturation, with the saturation voltage being at 300 millivolts or less. Thus, the input stage can operate with inputs In– and In+ within 300 millivolts of VCC.

The tail current sources for transistor pair Q3/Q4 and for transistor pair Q5/Q6 are controlled by a comparator circuit 10 having an inverting input coupled to receive input In– and a non-inverting input coupled to receive a reference voltage $V_{Ref}$. Voltage $V_{Ref}$ is typically produced using a band gap circuit or other similar voltage reference circuit which is constant with temperature and process. The true output of comparator circuit 10 is connected to control the state of a current source switching circuit 14, with the inverted output provided by inverter 12 being connected to control the state of a current source switching circuit 16.

Switching circuit 14 includes a differential transistor pair Q9 and Q10 which are connected to a common tail current source I2. The base of Q10 is connected to series-connected diodes D1, D2 and D3 which are connected to the output of current source IC. Diodes D1, D2 and D3 operate to bias the base of Q10 at a voltage between the high and low outputs of comparator circuit 10. The collector of Q9 is connected directly to the positive supply voltage, with the collector of Q10 being connected to transistor Q12 which acts as the input transistor of a current mirror circuit. Tail current source transistor Q13 functions as the current mirror circuit output transistor. Transistors Q12 and Q13 are the same size so that the transistors have essentially equal collector currents.

Switching circuit 16 is similar in construction to circuit 14 but is controlled by the output of inverter 12. A differential transistor pair Q7/Q8 is connected to a common tail current source I1, with I1 and I2 providing output currents of the same magnitude. Transistor Q8 is also biased by series-connected diodes D1, D2 and D3 so that the base voltage of Q8 is between the high and low outputs of inverter 12. The collector of transistor Q7 is connected directly to the positive supply rail, with the collector of Q8 being connected to transistor Q11 which forms the input transistor of a current mirror circuit. Tail current source transistor Q15 functions as the output transistor of the current mirror circuit. Transistors Q15 and Q11 are the same size so that the collector currents will be the same.

The reference voltage $V_{Ref}$ is selected to be the voltage at which the input circuit switches between input pair Q3/Q4 and input pair Q5/Q6. As previously noted in connection with the FIG. 1 circuit, it is usually preferable to switch differential pair at some input voltage displaced from the expected normal operating voltage so as to minimize switching between the pair. In the present example, $V_{Ref}$ is set to about +3.2 volts.

Figure 1:
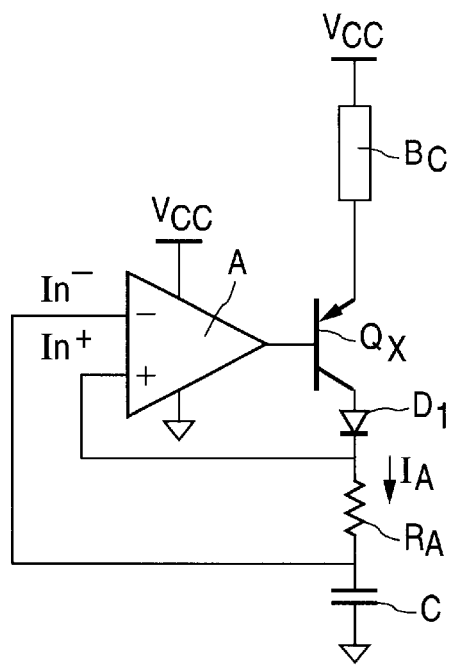
FIG. 1 is a block diagram of an exemplary conventional application of a prior art constant gm amplifier functioning as part of a current regulator circuit.

Assuming that amplifier A of FIG. 1 utilizes the input stage of FIG. 4, and assuming that the input voltage In− is less than $V_{Ref}$, the output of comparator circuit 10 will be high and the output of inverter 12 will be low. The high comparator circuit 10 output will cause transistor Q9 of the tail current switching circuit 14 to be on and conducting all of the current from current source I2. Thus, there will be no current flow through transistors Q10, Q12 and Q13 thereby rendering transistor pair Q5/Q6 inactive.

The low output of inverter 12 will cause transistor Q7 to be off so that all of the current from tail current source I1 will flow through transistor Q8. Since transistors Q11 and Q15 form a current mirror circuit, current I1 will flow out of tail current source transistor Q15 thereby rendering transistor pair Q3/Q4 active. Assuming that offset resistor R1 is 2 kohm, that the collector current of Q15 is 10 microamperes and that Q3 and Q4 are conducting equal current, the input offset voltage will be equal to voltage drop across R1, namely, 10 millivolts.

Should the input In− approach and then slightly exceed the value of $V_{Ref}$, the output of the comparator circuit 10 will rapidly change state. The low output of the comparator circuit will cause transistor Q9 to turn off so that all of the current from tail current source I2 will flow through transistors Q10, Q12 and Q13 thereby rendering transistor pair Q5/Q6 active. Since offset resistor R2 is equal in value to R1 and since currents I1 and I2 are equal, the input offset voltage will remain unchanged at 10 millivolts.

Current sources I1 and I2 are produced to have a temperature coefficient which will compensate for the temperature coefficient of offset resistors R1 and R2 so as to produce an input offset voltage which is relatively constant over temperature and process. The currents produced by sources I1 and I2 are inversely related to resistors R1 and R2. Thus, the currents will have a temperature coefficient which compensates for the temperature co-efficient of resistors R1 and R2 and which further compensates for process variations. Details regarding the implementation of current sources I1 and I2 will be subsequently provided.

Figure 3:
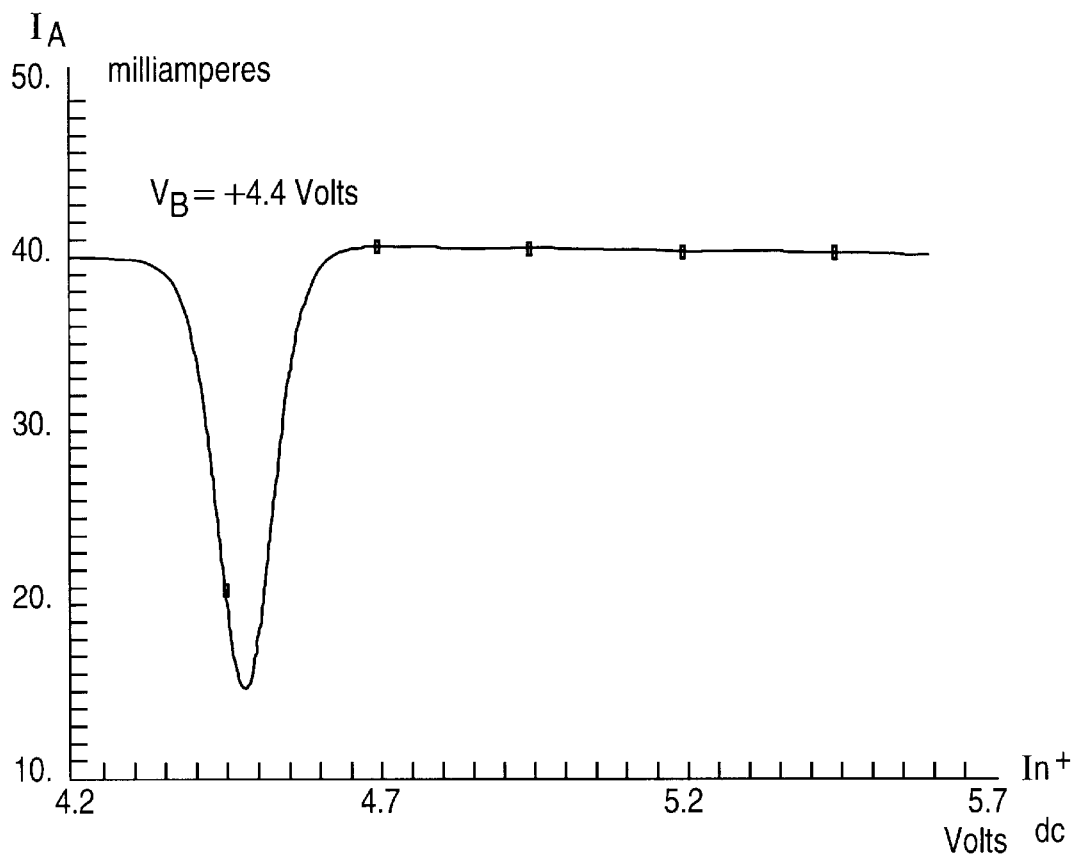
FIG. 3 is a graph illustrating a change in regulated output current of the FIG. 1 prior art circuit for a change in the common mode input voltage.
Figure 5:
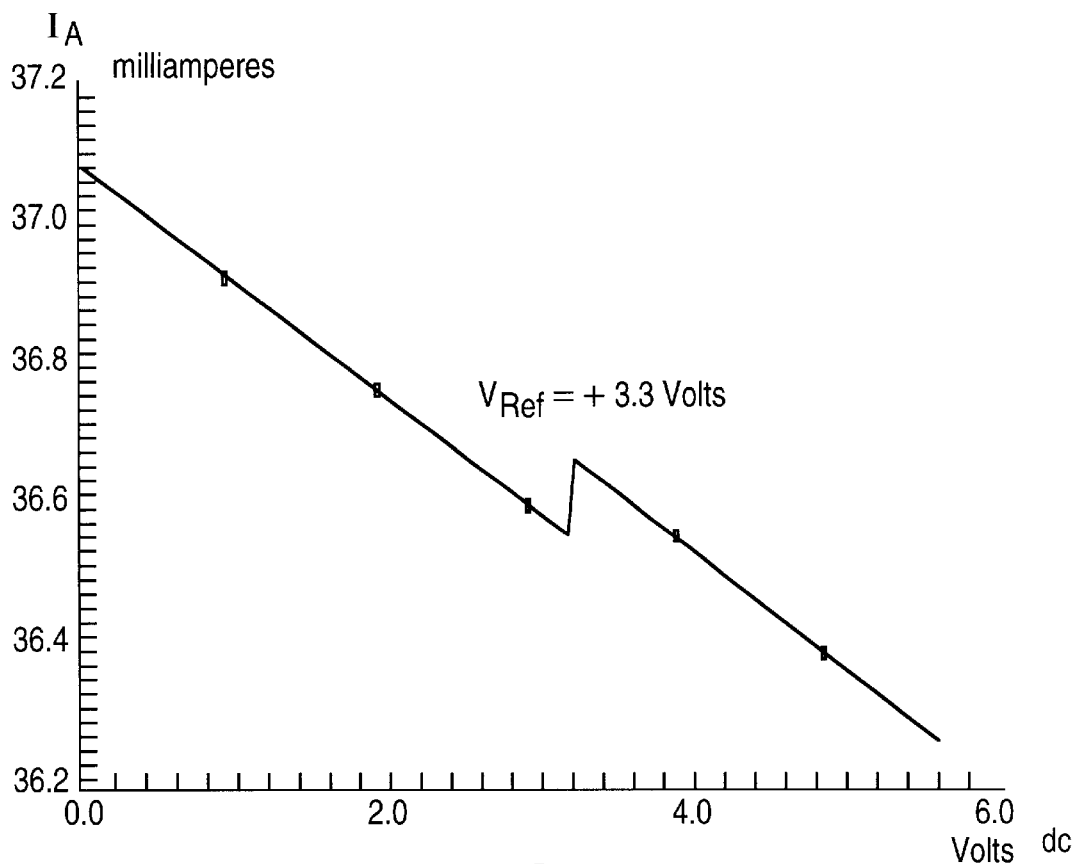
FIG. 5 is a graph, having a scale which differs from the graph of FIG. 3, illustrating the operation of the FIG. 1 circuit using an amplifier having an input stage of FIG. 4.

As can be seen by the graph of FIG. 5, the change in regulated output current IA drops very little as compared to that shown in FIG. 3, taking into account that the scale of the two graphs are significantly different. The drop in current IA shown in FIG. 5 with increases in input voltage is due primarily to the fact that amplifier A has a finite common mode rejection ratio.

Figure 2:
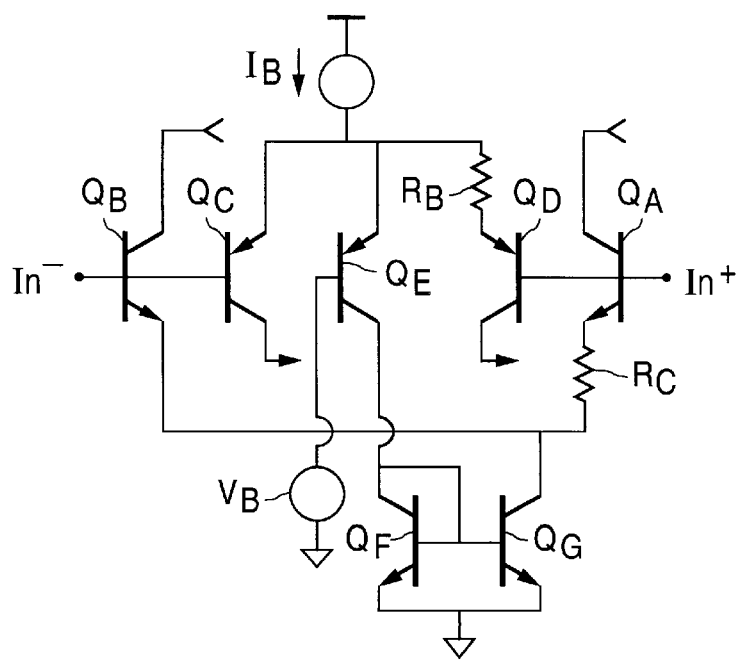
FIG. 2 is a schematic diagram of the input stage of the prior art amplifier of FIG. 1 using two differential input transistor pair to achieve operation with the input near or at the power supply rails.

It can be seen that the gm of amplifier A using the input stage of FIG. 4 is substantially more constant than the using the prior art input stage of FIG. 2. In addition, it is very easy to implement comparator circuit 10 to have hysteresis so that noise on inputs In+ and In− will not result in instability. The hysteresis is related to the common mode input voltage rather than the differential input voltage and is typically set to a few hundred millivolts.

Figure 6:
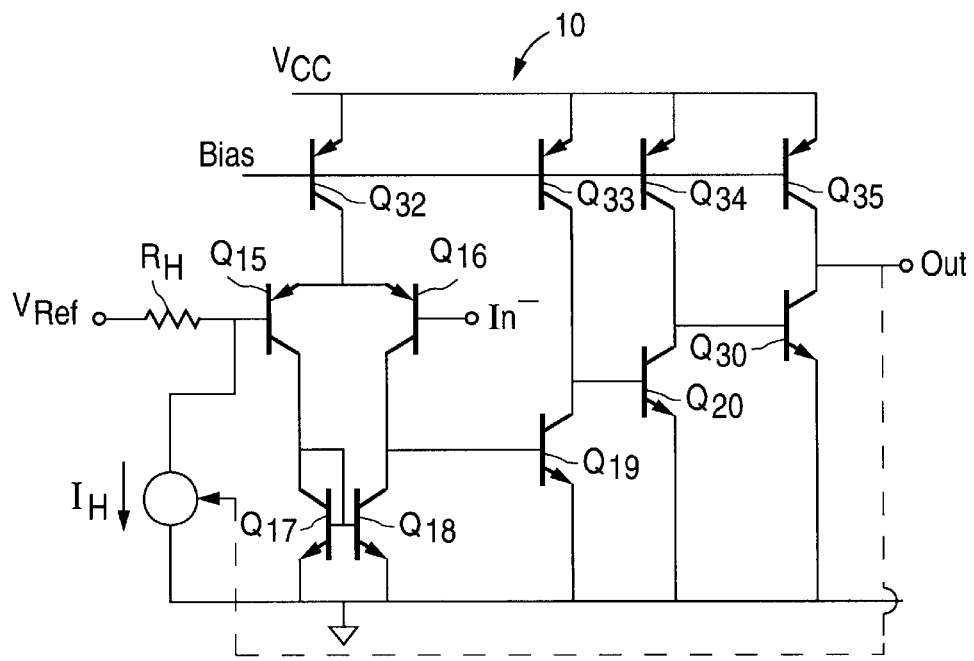
FIG. 6 is a schematic diagram of a comparator circuit of the FIG. 4 amplifier input stage.

Note that comparator 10 can effectively sense the common mode input voltage by monitoring either input In+ or In− rather than the actual common mode voltage, provided the differential voltage is relatively small. FIG. 6 is a schematic diagram of one implementation of comparator circuit 10. PNP transistors Q15 and Q16 form a differential input transistor pair, with the base of Q15 receiving reference voltage $V_{Ref}$ by way of a resistor RH. The base of transistor Q16 receives the input voltage In−. As will be described, a switchable current source IH, controlled by the output Out of the comparator circuit 10, is connected between the base of transistor Q15 and resistor RH. The current source IH and resistor RH operate to provide hysteresis for comparator circuit 10.

Transistors Q17 and Q18 form a current mirror load for the differential pair Q15/Q16. The output of the differential input stage is coupled to a first, second and third common-emitter amplifier stages which include transistors Q19, Q20 and Q30, respectively. PNP transistors Q33, Q34 and Q35 are, together with transistor Q32, biased by a common bias voltage and function as active loads for transistors Q19, Q20 and Q30, respectively.

Resistor RH and switchable current source IH operate to produce the desired hysteresis, as previously noted. Current source IH is switchable in response to the comparator output Out between a first state where it sinks current IH and a second state where no current is sunk. When output Out is high, current source IH is effectively turned off so that there is essentially no voltage drop across resistor RH. When Out is low, current source IH is active so that a voltage drop is created across resistor RH thereby effectively reducing the value of $V_{Ref}$ by a voltage equal to RH(IH), typically 200 millivolts.

Figure 7:
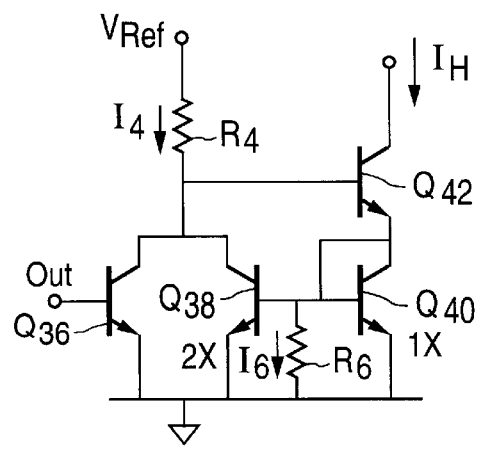
FIG. 7 is a schematic diagram of a current source circuit which can be used in implementing the FIG. 4 amplifier input stage.

FIG. 7 is a schematic diagram of one implementation of current source IH. Current source IH includes a control transistor Q36 having a base connected to the output Out of comparator circuit 10 and an emitter connected to the circuit common. A resistor R4 is connected between the collector of transistor Q36 and the voltage reference $V_{Ref}$ the same reference voltage connected to one terminal of resistor RH (FIG. 6). A further transistor Q38 has a collector connected to resistor R4 and an emitter connected to the circuit common. A transistor Q40 is included having a base and emitter coupled to the respective base and emitter of transistor Q38. Q38 has twice the emitter area of transistor Q40 so that transistor Q38 will conduct twice the collector current of transistor Q40. A resistor R6 is connected across the base-emitter junction of transistors Q38 and Q40. A fourth transistor Q40 has a base connected to the common collectors of Q36 and Q38 and an emitter connected to the collector of Q40. The collector of Q42 functions as the current source output IH.

When the output Out of comparator circuit 10 is low, control transistor 36 is off so that the collector current of transistor Q38 is equal to the current flow I4 through resistor R4. The voltage across R4 is as follows:

$$V_{R4}=V_{Ref}-(V_{BE42}+V_{BE40}) \quad (1)$$

Thus, the current I4 is as follows (assuming the base-emitter voltages are equal):

$$I4=(V_{Ref}-2V_{BE})/R4 \quad (2)$$

The current source output IH is as follows:

$$IH=I6+I_{Q40} \quad (3)$$

Assuming that I6 is equal to VBE/R6, that $I_{Q40}$ is equal to (I4)/2 and that R4 and R6 are equal to R, equations (2) and (3) can be combined as follows:

$$IH=VRef/(2R) \quad (4)$$

It can be seen from equation (4) that current IH is inversely proportional to the value R. Since the value of the hysteresis voltage is proportional to RH, the effects of temperature and process will cancel. Thus, the hysteresis voltage will be relatively constant over temperature and process. When signal Out is high, transistor Q36 will conduct all of the current from resistor R4 thereby causing current IH to drop to zero. Thus, the hysteresis voltage is eliminated.

The same implementation shown in FIG. 7 can be used for current sources I1 and I2. Since I1 and I2 are not switched, transistor Q36 is eliminated from the circuit.

Thus, a novel input stage for a constant gm amplifier capable of operating with inputs at or near the positive and negative supply rails has been disclosed. Although one embodiment has been described in some detail, it is to be understood that certain changes can be made by those skilled in the art without departing from the spirit and scope of the invention as defined by the appended claims.

What is claimed is:

1. An amplifier input stage comprising:
   first and second transistors having respective bases coupled to first and second amplifier stage inputs and having emitters coupled to a first common node;
   third and fourth transistors having respective bases coupled to the first and second amplifier input stage inputs and having emitters coupled to a second common node;
   a comparator circuit, separate from the first, second, third and fourth transistors, and configured to compare a first signal indicative of the input applied to the amplifier input stage inputs with a reference signal; and
   tail current source circuitry configured to selectively source current to the first and second common nodes in response to the comparator circuit.

2. The amplifier input stage of claim 1 where the tail current source circuitry includes a first current source and first switching circuitry configured to control an output of the first current source, a second current source and second switching circuitry configured to control an output of the second current source.

3. The amplifier input stage of claim 2 wherein the first current source includes a fifth transistor having a collector coupled to the first common node and the second current source includes a sixth transistor having a collector coupled to the second common node.

4. The amplifier output stage of claim 3 further including a first offset resistor coupled intermediate the first common node and the emitter of the second transistor such that a resistance between the first common node and the emitter of the second transistor is substantially larger than a resistance between the emitter of the first transistor and the first common node and a second offset resistor coupled intermediate the second common node and the emitter of the fourth transistor such that a resistance between the second common node and the emitter of the fourth transistor is substantially larger than a resistance between the emitter of the third transistor and the second common node.

5. The amplifier input stage of claim 4 further including a seventh transistor having a base-emitter junction coupled intermediate the first amplifier stage input and the base of the first transistor and an eighth transistor having a base-emitter junction coupled intermediate the second amplifier stage input and the second transistor base.

6. The amplifier input stage of claim 5 wherein the first, second, third and fourth transistors are of a first conductivity type and the seventh and eighth transistors are of a second conductivity type opposite the first conductivity type.

7. The amplifier input stage of claim 6 wherein the first conductivity type transistors are PNP transistors and the second conductivity type transistors are NPN transistors.

8. The amplifier input stage of claim 4 wherein the first signal indicative of the input is one of the first and second amplifier stage inputs.

9. The amplifier input stage of claim 3 wherein the first switching circuitry includes seventh and eighth transistors having common emitters coupled to a third current source and wherein the second switching circuitry includes ninth and tenth transistors having common emitters coupled to a fourth current source and wherein the comparator circuit switches between a first state which causes the eighth transistor to conduct substantially all current provided by the third current source and the ninth transistor to conduct substantially all of the current provided by the fourth current source and a second state which causes the seventh transistor to conduct substantially all of the current provided by the third current source and the tenth transistor to conduct substantially all of the current provided by the fourth current source.

10. The amplifier input stage of claim 9 wherein the eighth transistor collector is coupled to an input half of a first current mirror circuit, with an output half of the first current mirror circuit including the fifth transistor and wherein the tenth transistor is coupled to an input half of a second current mirror circuit, with an output half of the second current mirror circuit including the sixth transistor.

11. An amplifier input stage comprising:
   a first differential transistor pair having respective bases coupled to first and second amplifier input stage inputs;
   a second differential transistor pair having respective bases coupled to the first and second amplifier input stage inputs;

a comparator circuit, which includes first and second transistors which form a third differential transistor pair, with the first transistor having a base for receiving a reference signal and the second transistor having a base for receiving a signal indicative of the input applied to the amplifier input stage inputs, with the comparator circuit switching between first and second states in response to relative magnitudes of the reference signal and the signal indicative of the input; and tail current source circuitry configured to provide current to the first differential transistor pair and not the second differential pair when the comparator circuit is in the first state and to provide current to the second differential pair and not the first differential pair when the comparator circuit is in the second state.

12. A method of controlling an amplifier input stage which includes a first differential transistor pair having respective bases coupled to the input stage inputs and a second differential transistor pair having respective bases coupled to the input stage inputs, said method comprising:

providing a third differential transistor pair;

coupling a reference signal to a base of a first transistor of the third differential transistor pair;

coupling an input signal indicative of the input stage inputs to a base of a second transistor of the third differential pair;

providing an output having first and second states based upon relative magnitudes of current flow through the first and second transistors;

coupling a tail current to the first differential pair, and not the second differential pair, when the output is in the second state; and coupling a tail current to the second differential pair, and not the first differential pair, when the output is in the first state.

* * * * *